United States Patent

Heath et al.

[11] Patent Number: 6,159,620
[45] Date of Patent: Dec. 12, 2000

[54] SINGLE-ELECTRON SOLID STATE ELECTRONIC DEVICE

[75] Inventors: James R. Heath, Santa Monica; Daniel V. Leff, Palo Alto, both of Calif.; Gil Markovich, Tel Aviv, Israel

[73] Assignee: The Regents of the University of California, Oakland, Calif.

[21] Appl. No.: 09/052,235

[22] Filed: Mar. 31, 1998

Related U.S. Application Data

[60] Provisional application No. 60/042,207, Mar. 31, 1997.

[51] Int. Cl.⁷ .................................................. B32B 15/08
[52] U.S. Cl. .......................................... 428/615; 428/626
[58] Field of Search ...................................... 428/615, 626

[56] References Cited

U.S. PATENT DOCUMENTS

| | | | |
|---|---|---|---|
| 3,885,196 | 5/1975 | Fischer | 313/498 |
| 3,894,332 | 7/1975 | Nathanson et al. | 29/578 |
| 4,025,910 | 5/1977 | Walker | 340/173 |
| 4,746,587 | 5/1988 | Nicholas | 430/296 X |
| 5,270,221 | 12/1993 | Garcia et al. | 437/116 |
| 5,345,104 | 9/1994 | Prall et al. | 257/607 |
| 5,633,493 | 5/1997 | Suzuki et al. | 250/207 |
| 5,830,538 | 11/1998 | Gates et al. | 427/535 |

*Primary Examiner*—Francis J. Lorin
*Attorney, Agent, or Firm*—Oppenheimer Wolff & Donnelly LLP

[57] ABSTRACT

A single-electron solid state electronic device is characterized by organically functionalized nanometer size metal and metal alloy nanocrystal active elements. The electronic behavior of the device is distinguished by single electron charging phenomena, displaying characteristic Coulomb Blockade and Coulomb Staircase signatures.

23 Claims, 4 Drawing Sheets

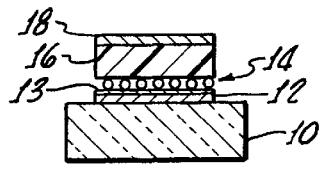
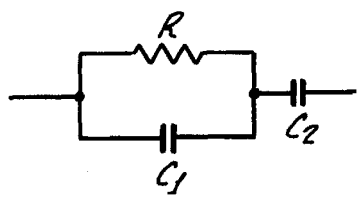
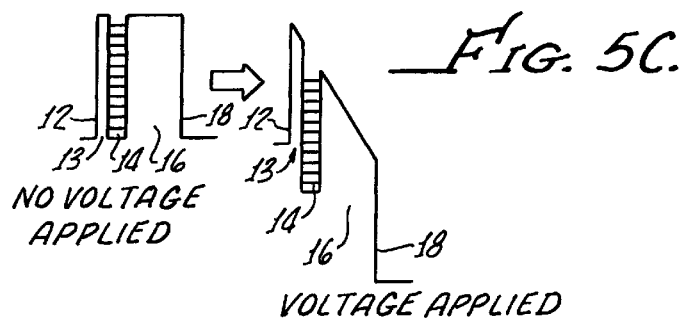
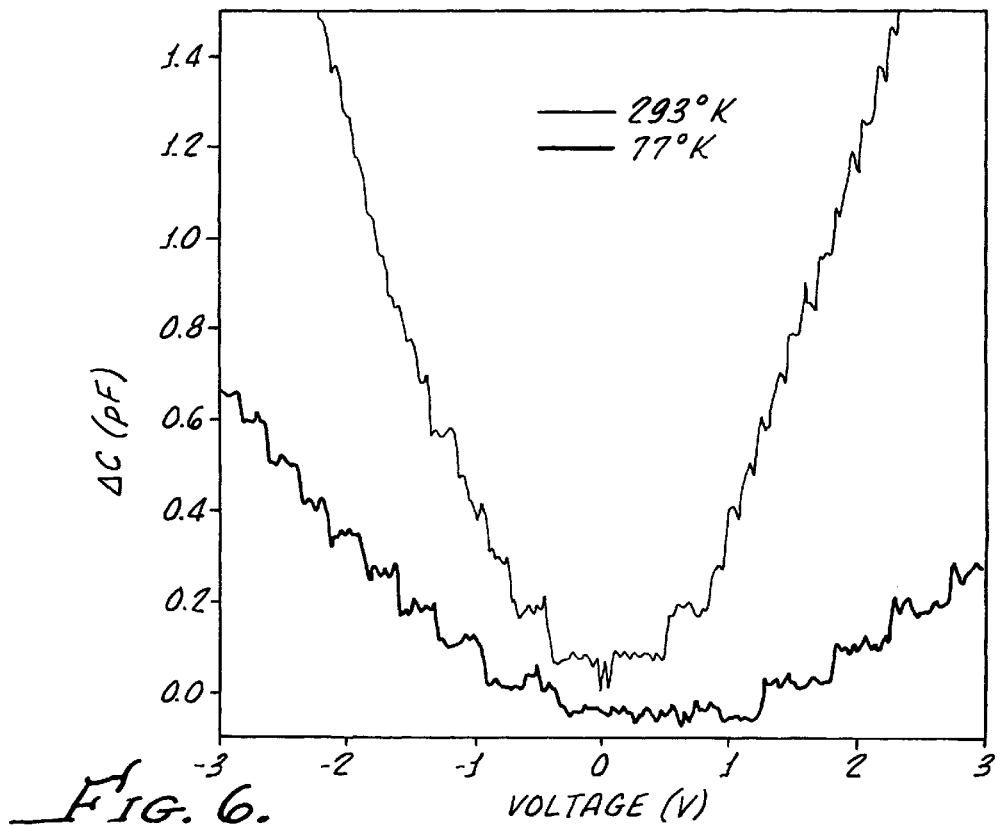

SINGLE-ELECTRON SOLID STATE ELECTRONIC DEVICE

This application claims the benefit of U.S. Provisional Application No. 60/042,207, filed Mar. 31, 1997.

FIELD OF THE INVENTION

This invention relates to single-electron solid state electronic devices based on organically functionalized metal and metal alloy nanocrystals.

BACKGROUND OF THE INVENTION

Single-electron tunneling or charging has been proposed as a basis for the room temperature operation of electronic devices in which nanometer size particles serve as the functional or active elements of the device. Such devices have a number of proposed advantages over bulk size electronic devices. These advantages include negligible power consumption, faster computation or tasking abilities, greatly increased device element densities, and the potential for multiple status states rather than just "on" or "off" states.

One promising route to the fabrication of single-electron devices is the use of nanometer size metal and semiconductor particles as active device elements. Passivated nanoparticles of coinage metals may be particularly useful for these devices.

For single-electron charging to be observed in such devices the following conditions must be met: (1) The active elements of the device must have finite charging energies for a single electron. This charging energy ($E = e^2/2C$) is large when the electrical capacitance (C) of the functional elements of the device is small. Usually, a small capacitance implies small physical dimensions of the device; and (2) The charging energy of the device must be at least a few times greater than the thermal energy at the temperature at which the device is to be operated ($E \gg kT$). For operation above a few degrees K, this criterion implies that the device must have a charging energy that is greater than a few millivolts. For operation at 77° K (liquid nitrogen temperature) a single-electron charging energy on the order of 0.10 V is desirable.

Two main approaches to the fabrication of single-electron devices have been developed. The first, a "top-down" approach, is to use state-of-the-art electron beam lithography techniques and semiconductor processing technologies to produce very small tunneling junctions. These junctions may be made of two metal conductors with an insulating gap between them, or alternatively, they made be made of a semiconductor quantum dot structure, which may also have a very small capacitance. Such devices can be reduced down to the 100 nm size range and have capacitances as low as $10^{-17}$ F. However, these devices have two basic limitations: 1) they exhibit single-electron charging only at very low temperatures ($T \leq 4°$ K), thus rendering them ineffective under normal operating conditions; 2) large scale production of these nanoelectronic devices is very difficult to achieve because they are fabricated by serial rather than parallel processes.

A variant of the top-down approach for fabricating single-electron devices is the hybrid approach in which a voltage threshold-shifting, single transistor memory device is used. Fabrication is by conventional n-MOS transistor processes, with the exception that the introduction of the nanocrystals was achieved by limited nanocrystal seeding followed by deposition of a control oxide. The resulting device is essentially a silicon field-effect transistor (FET) with a random arrangement of nanocrystals of silicon or germanium (1–10 nm) placed in the gate oxide region in close proximity to the inversion surface. Injection of electrons into the nanocrystals occurs from the inversion layer via direct tunneling when the control gate is forward biased with respect to the source and drain. The resulting stored charge on the nanocrystals causes a shift in the threshold voltage of the device. Although this device is characterized by fast read and write times as well as long charge retention times, its use is limited because of the lack of control over the size and size distribution and the disordered geometric arrangement of the nanocrystals used, which leads to unpredictable and inconsistent device performance.

Furthermore, the use of semiconductor nanocrystals rather than metal nanocrystals results in the energy level spectrum of the device being quite complicated. Classical electrostatics, as well as the discrete energy level spectrum of the band structure that arises from quantum confinement of carriers, must be taken into account in the case of semiconductor nanocrystals. For metal nanocrystals, on the other hand, the energy level spectrum of the device would be governed by simple electrostatics. Another limitation of the semiconductor nanocrystal device is that the lack of control over the size, size distribution, and ordering of the nanocrystals can result in serious complications for device operation especially for multistate operation. This is due to the strong influence of these parameters on the potential energy of the stored electrons, the transmission efficiency for the storage from the inversion layer, and the coulombic energy that discourages the injection and storage of more electrons.

The second main approach used to construct single-electron devices, termed a "bottom-up" approach, is to fabricate them from molecular or atomic precursors by precisely positioning and assembling the nanometer size building blocks into patterned arrays. This first involves the use of one of a number of chemical schemes for preparing the nanoparticles. Techniques such as chemical vapor deposition (CVD), chemical synthesis, chemical self-assembly, and molecular recognition have been used. Second, the materials are arranged into patterned arrays by using one of a variety of methods that include scanning tunneling microscopy (STM), Langmuir-Blodgett film preparation, self-assembly, spin-coating, and the like. In general, the tasks of synthesizing the requisite materials and placing them into specific chemical environments or geometric arrangements are nontrivial.

Single-electron charging in granular metal films at liquid helium temperature (4° K) has been observed. These films were produced by vacuum deposition of the metal vapor on an insulating substrate, the deposited metal forming isolated, random islands on the substrate. Such particles are typically disc-shaped with diameters of the order of 10 nm or more and capacitances of the order of $10^{-18}$ to $10^{-17}$ F. Films produced by this method are highly disordered and the particles are characterized by broad relative size distributions (typically, $\sigma \approx 50\%$). These limitations result in inconsistent electron charging effects in the metal films.

Single-electron charging at room temperature of individual colloidal metal nanocrystals supported on a surface has been observed by the use of Scanning Tunneling Microscopy (STM). Small, colloidal metal particles are characterized by size-dependent charging energies which, for a 2 nm particle, are about 0.3 V in vacuum. However, although displaying the anticipated physical phenomena the practical utilization of such colloidal metal particles has not been realized.

The conductance of a particle monolayer measured transversely along the layer and current/voltage curves have been obtained. However, no proof of single-electron tunneling or charging has been shown for such monolayers. In addition, use of spin casting techniques to form the layer of particles make possible only limited control over array structure.

It would therefore be advantageous to provide single-electron solid state electronic devices that are not characterized by the limitations discussed previously.

SUMMARY OF THE INVENTION

It has now been found that single-electron solid state electronic devices, for example, solid state capacitance devices, can be based on organically functionalized metal and metal alloy nanocrystals which possess the characteristics mentioned above and which circumvent the limitations of the single-electron devices previously available.

The single-electron solid state electronic devices of this invention contain a substrate, a first conductive thin film layer deposited on the substrate, a thin film nanocrystal layer of metal or metal alloy nanocrystals deposited on and in contact with the first conductive thin layer, a dielectric spacer layer in contact with the thin film nanocrystal layer, and a second conductive thin film layer deposited on and in contact with the dielectric spacer layer.

The single-electron solid state devices of the present invention are provided by the following three key steps: (1) producing organically functionalized metal and metal alloy nanocrystals over the size range of 1–10 nm; (2) forming well-ordered or disordered monolayer or multilayer assemblies of these nanocrystals upon various substrates, such as Si, SiO$_2$, alumina, mica, GaAs, indium tin oxide, glasses, and polymer films, or placing the nanocrystals into one of a variety of complex chemical environments, such as polymers, glasses, silica, alumina, sol-gels and glassy carbon, to create a nanocrystal matrix composite; and (3) incorporating these monolayer or multilayer assemblies or nanocrystal matrix composites into solid state devices as the active device elements, preferably by means of parallel fabrication.

More particularly, the single-electron solid state electronic devices of this invention are prepared by the steps of providing a substrate, depositing a first conductive thin film layer upon the substrate, depositing a thin film nanocrystal layer of metal or metal alloy nanocrystals upon and in contact with the first conductive thin film layer, forming a dielectric spacer layer in contact with the thin film nanocrystal layer, and depositing a second conductive thin film layer upon and in contact with the dielectric spacer layer.

The single-electron solid state devices of the present invention are distinguished over prior art devices by the possession of the following characteristics: (1) the ability to operate at room temperature; (2) the ability to operate with multiple status states; (3) the ability to store varying amounts of electronic charge; (4) the capability of having an energy level spectrum dominated by simple electrostatics; (5) the ability to be constructed by parallel rather than serial fabrication techniques; (6) the ability to control the size and size distribution of the metal and/or metal alloy nanocrystals comprising the active device elements; (7) the ability to control the geometric arrangement and lateral and vertical densities of assemblies of the nanocrystals; (8) the ability to place the nanocrystals into complex environments, such as polymers, glasses, silica, alumina, sol-gels, and glassy carbon; (9) the ability to deposit the nanocrystals onto various substrates, such as Si, SiO$_2$, alumina, mica, GaAs, indium tin oxide, glasses, and polymer films; and (10) the ability to fabricate monolayers as well as multilayers of the nanocrystals comprising the active device elements.

BRIEF DESCRIPTION OF THE DRAWINGS

FIG. 5A is a diagrammatic cross-sectional view of a single-electron capacitance device in a sandwich-type configuration.

FIG. 5B is a schematic diagram of an RC circuit which is the equivalent of one of many parallel double tunnel junctions comprising the single-electron capacitance device of FIG. 5A.

FIG. 5C is a pictorial diagram of the energy level structure of a single-electron capacitance device.

FIG. 6 is a graph of D capacitance-voltage characteristics of a single-electron capacitance device operated at 77° K and 293° K.

DETAILED DESCRIPTION OF THE INVENTION

Figure 1:
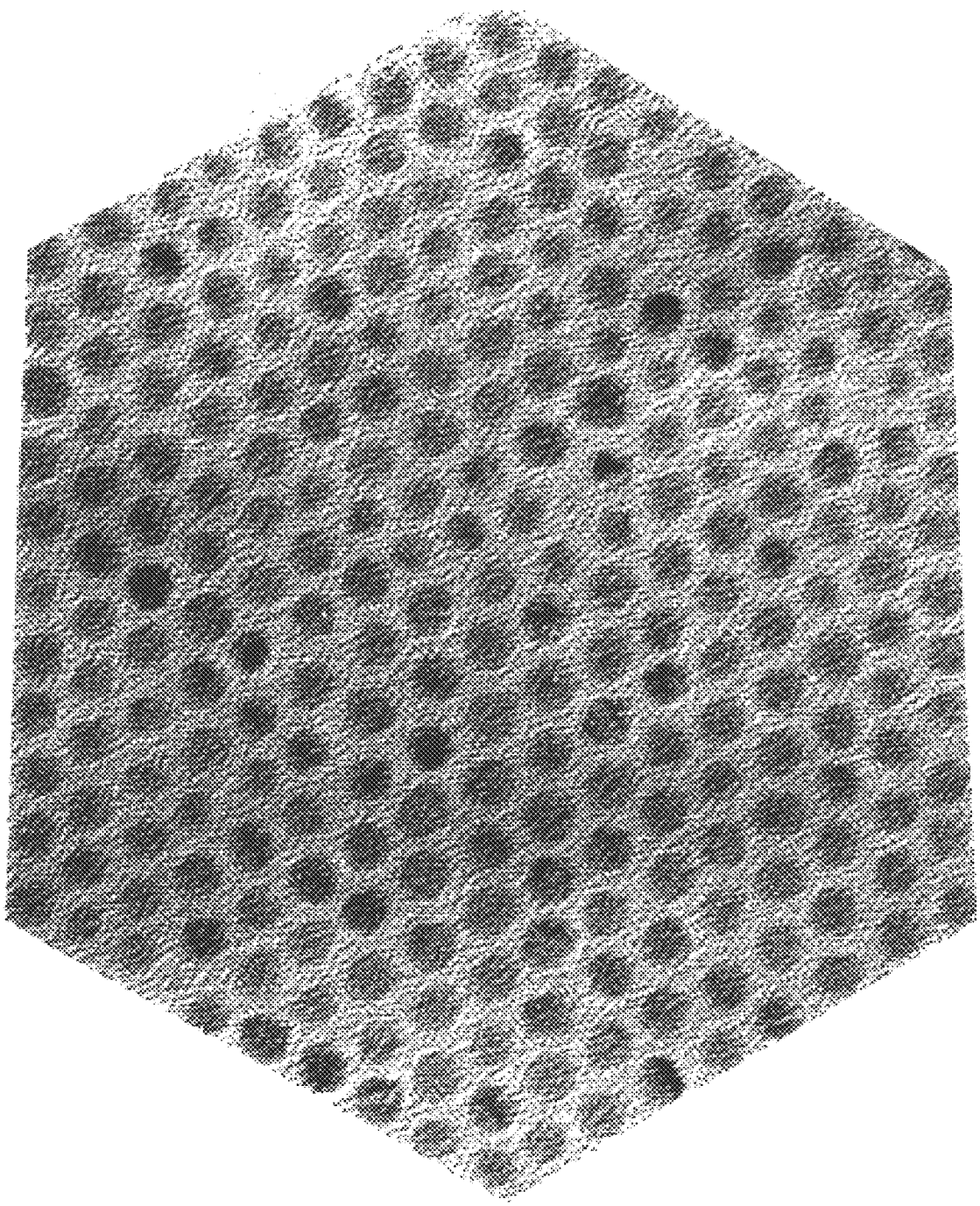
FIG. 1 is a cropped transmission electron micrograph (TEM) of a nanocrystal monolayer film.

The first step in producing the single-electron solid state devices of the present invention is preparing the organically functionalized metal or metal alloy nanocrystals.

By use of the term "nanocrystals" herein is meant single crystal particles having an average cross-section no larger than about 20 nanometers (nm) ($20 \times 10^{-9}$ meters or 200 Angstroms (Å)), preferably no larger than about 10 nm (100 Å) and a minimum average cross-section of about 1 nm (10 Å). However, in some instances, smaller average cross-section nanocrystals down to about 0.5 nm (5 Å) may be acceptable. The nanocrystals employed in the devices of the present invention will typically have an average cross-section ranging in size from about 1 nm (10 Å) to 10 nm (100 Å).

By use of the term "metal nanocrystals" is meant nanometer-size crystals of the following: (1) alkali metals; (2) alkaline earth metals; (3) transition metals; (4) Group IIIa metals; or (5) Group IVa metals.

By use of the terms "metal alloy nanocrystals" is meant nanometer-size crystals formed from the combination of one or more metals defined above as "metal nanocrystals."

By use of the term "organically functionalized nanocrystals" is meant that the nanocrystals have, bound to their surface, organic molecules with specific functionalities. These organic groups impart special properties, such as solubility in various media, to the nanocrystals and serve as metal surface passivants. The following is a list of molecules or classes of molecules that may serve as the organic surface passivants that bind to the metal or metal alloy nanocrystal surface: compounds of the formula R—X, wherein R is an alkyl, aryl, alkynyl, or alkenyl group, and X is a group which can bind to the metal surface via strong or weak interactions. Possible R—X compounds include, for example, thiols, phosphines, oxyphosphines, amines, oxides, alcohols, esters, ketones, disulfides, and amides.

All of the metal and metal alloy nanocrystals incorporated into the electronic devices of the present invention may be prepared in the following general manner: A solution or dispersion of a metal precursor (or precursors, for alloys), is mixed with a solution of an organic surface passivant and the resulting mixture is reacted with a reducing agent to reduce the metal precursor (or precursors, for alloys) to free metal while concomitantly binding the organic surface passivant to the resulting free metal surface to produce organically functionalized metal or metal alloy nanoparticles having a particle diameter of 10–100 Å. In a preferred embodiment of the invention, an organic solution of a phase transfer agent is mixed with the metal precursor (or precursors, for alloys) prior to mixing with the organic surface passivant. All of the metal and metal alloy nanocrystals that have been incorporated into the electronic devices of the present invention possess the following characteristics: (1) they are soluble and resoluble in aqueous and various organic media, including organic solutions containing dissolved polymers; (2) they are stable as powders or monodisperse (non-aggregated) colloids under ambient conditions for at least several days; (3) they are stable for months when stored under low temperature conditions as powders or monodisperse (non-aggregated) colloids in solution; (4) they can exist as monodisperse entities (when prepared as organic colloids) which can be readily separated into arbitrarily narrow size distributions via various chemical and chromatographic techniques; (5) they can be prepared in at least gram quantities; (6) they may consist of a variety of metallic elements prepared as either pure metal particles or alloys, synthesized from the combination of specific metal-containing inorganic compounds, phase transfer catalysts, surface passivants, and reducing agents; (7) they are readily dispersed into various matrices or onto various substrates, such as gels, polymers, glasses, alumina, silica, and the like; and (8) they can be arranged into two- and three-dimensional close-packed ordered arrays to form "superlattices" exhibiting novel electronic properties dominated by single-electron phenomena. Preferred nanocrystals are Au, Ag, Co, Sn, Fe, Cu, Ni, Pt, Rh, Pd, and Co/Au alloy. Preferred particle sizes range, from 1–10 nm diameter.

An exemplary synthetic scheme is as follows. An inorganic gold compound such as $HAuCl_4$ is dissolved in $H_2O$ to generate a solution containing $AuCl_4^-$ as the active metal reagent. $AuCl_4^-$ is phase transferred from the $H_2O$ into an organic phase such as toluene, using an excess of a phase transfer reagent or catalyst such as $N(C_8H_{17})_4Br$. A stoichiometric amount of an alkylthiol such as $C_6H_{13}SH$ dissolved in an organic solvent such as toluene is added to the organic phase. Excess reducing agent such as $NaBH_4$ is dissolved in $H_2O$, added to the organic mixture with rapid stirring, and the reaction mixture is allowed to continue to stir for several hours. The aqueous layer is removed and discarded. The organic layer is passed through submicron filter paper. No material is removed and all color passes through the paper. The organically functionalized metal nanocrystals are precipitated using an alcohol solution such as ethanol kept at low temperature. The filtrate is washed with this same alcohol. The particles are redissolved in an organic solvent such as toluene, reprecipitated, and rewashed. The particles are finally redissolved in an organic solvent such as hexane or toluene.

Au particles with one phase transfer reagent and an alkylamine as the surface passivant can be prepared using an alkylamine such as $C_{12}H_{25}NH_2$ or $C_{18}H_{35}NH_2$ as the surface passivant rather than an alkylthiol.

Au particles with no phase transfer reagent and an alkylamine as the surface passivant can be prepared using an alkylamine such as $C_{12}H_{25}NH_2$ or $C_{18}H_{35}NH_2$ as the surface passivant rather than an alkylthiol, and no phase transfer reagent. A small amount of insoluble black solid particulate material is generated during the synthesis. This precipitate is removed by filtration of the two-phase system with submicron filter paper. The precipitation of the organically functionalized metal nanocrystals then proceeds in the same manner as above.

Ag particles with one phase transfer reagent and an alkylthiol as the surface passivant can be prepared using an inorganic silver compound such as $AgNO_3$ or $AgClO_4 \cdot H_2O$ as the metal source, which, when dissolved in $H_2O$, yields $Ag^+$ as the active metal reagent.

Pt particles with one phase transfer reagent and an alkylamine as the surface passivant can be prepared using an alkylamine such as $C_{12}H_{25}NH_2$ or $C_{18}H_{35}NH_2$ as the surface passivant and an inorganic platinum compound such as $H_2PtCl_6 \cdot 3H_2O$ as the metal source, which, when dissolved in $H_2O$, yields $PtCl_6^{-2}$ as the active metal reagent.

Pd particles with one phase transfer reagent and an alkylamine as the surface passivant can be prepared using an alkylamine such as $C_{12}H_{25}NH_2$ or $C_{18}H_{35}NH_2$ as the surface passivant and an inorganic palladium compound such as $Na_2PdCl_6 \cdot 4H_2O$ as the metal source, which, when dissolved in $H_2O$, yields $PdCl_6^{-2}$ as the active metal reagent.

Co/Au alloy particles with two phase transfer reagents and an alkylthiol as the surface passivant can be prepared as follows. An inorganic cobalt compound such as $CoCl_2 \cdot H_2O$ is dissolved in $H_2O$ to generate a solution containing $Co^{+2}$ as the active metal reagent. $Co^{+2}$ is phase transferred from $H_2O$ into an organic phase such as toluene using an excess of a phase transfer reagent or catalyst such as $(C_6H_5)_4BNa$. The aqueous layer is removed and the organic layer is washed with $H_2O$. An inorganic gold compound such as $HAuCl_4$ is dissolved in $H_2O$ to generate a solution containing $AuCl_4^-$ as the active metal reagent. $AuCl_4^-$ is phase transferred from $H_2O$ into an organic phase such as toluene using an excess of a phase transfer reagent or catalyst such as $N(C_8H_{17})_4Br$. The aqueous layer is removed and the organic layer is washed with $H_2O$. The two organic solutions are combined to form a mixture of $Co^{+2}$ and $AuCl_4^{-4}$. A stoichiometric amount of an alkylthiol such as $C_{12}H_{25}SH$ dissolved in toluene is added to the organic mixture. Excess reducing agent such as $NaBH_4$ is dissolved in $H_2O$, added to the organic mixture with rapid stirring, and allowed to continue to stir for several hours. The aqueous layer is removed and discarded. The organic layer is passed through submicron filter paper. No material is removed and all color passes through the filter paper. The organically functionalized alloy nanocrystals are precipitated using an alcohol solution such as ethanol kept at low temperature. The filtrate is washed with this same alcohol. The particles are redissolved in an organic solvent such as toluene, reprecipitated, and rewashed. The particles are finally redissolved in an organic solvent such as hexane or toluene.

Solubilization of organically functionalized nanocrystals in aqueous media can be accomplished as follows: One method is to prepare the particles with surface passivants that possess hydrophilic moieties. Another method can be described as follows: The nanocrystals are first prepared according to one of the synthetic schemes described above. A concentrated solution (e.g., 6 mg/mL) of the particular nanocrystals is prepared in an organic solvent such as hexane to yield an intensely colored (e.g., purple or brown) solution. A separate solution consisting of a specific weight % of a soap or detergent molecule in aqueous media is prepared. The term "soap" or "detergent" is general here and is taken to mean any molecule that has a polar (hydrophilic) ionic region and a nonpolar (hydrophobic) hydrocarbon region (e.g., a fatty acid or an alkali metal alkane sulfonate salt). When dissolved in aqueous media under the appropriate conditions, these soaps and detergents will form structures called micelles. A micelle is basically any water-soluble aggregate, spontaneously and reversibly formed from amphiphile molecules. These aggregates can adopt a variety of three-dimensional structures (e.g., spheres, disks, and bilayers) in which the hydrophobic moieties are segregated from the solvent by self-aggregation. If the hydrophobic portion of the amphiphile is a hydrocarbon chain, the micelles will consist of a hydrocarbon core, with the polar groups at the surface serving to maintain solubility in water. A nonpolar substance is solubilized in the hydrophobic region of these micelle structures. This is the perceived mechanism by which the soap or detergent solution solubilizes the organically functionalized nanocrystals. A known amount of the nanocrystal solution is added to a known amount of the colorless soap solution, resulting in a two-layer mixture. This mixture is stirred vigorously for a period of at least 12 hours. The color of the organic solution is transferred to the soap solution, and this signifies the solubilization of the metal nanocrystals in the aqueous media. The result is an intensely colored single layer solution containing a small amount of bulk metal that precipitates during the solubilization process. This metal precipitate is removed by filtration with submicron filter paper. The entire above procedure can be repeated several times in order to repeatedly increase the concentration of the metal nanocrystals in the aqueous media.

The following examples illustrate specific embodiments of the present invention in relation to nanocrystal preparation and characterization. In the following examples all reactions were performed at room temperature, ambient pressure, and ambient atmosphere.

EXAMPLE 1

(a) 150 mg (0.380 mmol) of $HAuCl_4 \cdot 3H_2O$ was dissolved by stirring in 25 mL of deionized water to yield a clear, yellow solution;

(b) 0.365 g (0.667 mmol) of $N(C_8H_{17})_4Br$ was dissolved by stirring in 25 mL of toluene to yield a clear solution and then added to the rapidly-stirring aqueous solution of the Au salt (solution (a)). An immediate two-layer separation resulted, with an orange/red organic phase on top and an orange-tinted aqueous phase on the bottom. This mixture is vigorously stirred until all color disappeared from the aqueous phase, indicating quantitative transfer of the $AuCl_4$ moiety into the organic phase;

(c) 0.0190 g (0.0226 mL; 0.108 mmol) of $C_{10}H_{21}SH$ was placed in 25 mL of toluene and then this mixture was added to the rapidly stirring two-phase mixture from (a) and (b);

(d) 0.151 g (4.00 mmol) of $NaBH_4$ was dissolved in 25 mL of deionized water to yield an effervescent, cloudy solution and then this mixture was added to the rapidly stirring mixture from (a), (b), and (c). There was an instant color change of the organic phase to black/brown and then quickly (1 minute) to dark purple. After 10 minutes, the aqueous layer became clear and colorless. The reaction was continued at room temperature and room pressure (kept open to ambient atmosphere) for ≈12 hour while rapidly stirring. Once the reaction time was finished, the aqueous phase was separated and discarded, and the dark purple organic phase was reduced in volume to ≈5 mL by rotary evaporation. To this 5 mL toluene/particle solution was added 350 mL of methanol and this mixture was cooled to −60° C. for twelve hours. The dark purple/black precipitate was then vacuum filtered using 0.65 μm nylon filter paper, washed with an excess of methanol (200 mL), and dried on a vacuum line to give ≈60 mg of dry product. This 60 mg of particles was redissolved in 50 mL of toluene, reprecipitated, and rewashed by the procedure described just previously, to yield 40 mg of dry product. The particles were finally either stored as a powder in the freezer or at room temperature, or they were redissolved in a preferred amount of an organic solvent, such as hexane, toluene, chloroform, and the like to yield a solution with a concentration ranging from 1–30 mg/mL. These solutions were either stored in the freezer or at room temperature.

The nanoparticles were characterized by the following:

(a) X-ray diffraction (XRD): This characterization, performed on a powder of the particles, showed that the particles were crystalline with diffraction peaks like those of fcc Au (except for the broadening at finite size). The main reflections were: (111) at $2\Theta$=approx. 64.6°, (311) at $2\Theta$=approx. 38.2°, (200) at $2\Theta$=approx. 44.4°, (220) at $2\Theta$=approx. 64.6°, (311) at $2\Theta$=approx. 77.5°, (222) at $2\Theta$=approx. 81.8°. Also, using diffraction peak line-width broadening, the average domain size was determined to be 70±7 Å;

(b) Ultraviolet-visible spectroscopy (UV/vis): This characterization, performed on dilute hexane or toluene solutions of the nanoparticles, showed one main, broad absorption feature at $\lambda_{max}$=521 nm;

(c) infrared spectroscopy (IR): This characterization, performed on a film of solid particles that were deposited on an NaCl window by evaporation of several drops of a particle/hexane solution, showed the standard C—C and C—H stretches, as well as those for the thiol group. The stretches were in the regions of 2950–2750 $cm^{-1}$, and 750–650 $cm^{-1}$;

(d) Nuclear magnetic resonance spectroscopy (NMR): This characterization, performed on concentrated particle/$CDCl_3$ solutions (10 mg/mL), showed three broad multiplets at $\delta$=1.50, 1.30, and 0.90 ppm, with intensities of roughly 2:2:1. These peaks are superimposed on a fourth, very broad signal in the range of $\delta$=2.1–60 ppm;

(e) Transmission electron microscopy (TEM): This characterization, performed on samples prepared by evaporating a drop of a dilute particle/hexane solution onto an amorphous carbon-coated Cu TEM grid, yielded TEM micrographs of the particles which indicated that the particles were predominantly spherical in morphology, that they were present with a broad size distribution ($\sigma$≈20%), and that the average domain size was ≈65 Å;

(f) X-ray photoelectron spectroscopy (XPS): This characterization, performed on a uniform film of nanoparticles (several micrometers thick) supported on nylon filter paper, showed the appropriate signals for gold ($5p_{3/2}$, $4f_{7/2}$, $4f_{5/2}$, $4d_{5/2}$, $4d_{3/2}$, and $4p_{3/2}$ at ≈59, 84, 87, 336, 355, and 548 eV, respectively), carbon (1s at ≈285.3 eV), and Oxygen (1s at ≈531.8 eV). Also observed were signals for Br ($3p_{3/2}$ peak at 183.5 eV, $3p_{1/2}$ peak at 189.5 eV, and 3d peak at ≈68.0 eV). The peak positions, line shapes, and peak-to-peak distance of the Au 4f doublet are the standard measure of the gold oxidation state. The binding energies for the Au 4f doublet are 83.5(3) and 87.2(3) eV (peak-to-peak distance of 3.7 eV). These measurements are consistent with the Au° oxidation state;

(g) Elemental analysis (EA): The analyses yielded 77.06% Au, 2.99% S, 2.86% H, and 17.14% C. The corresponding Au:S molar ratio of the nanoparticles was 4.20:1, and the C:H and C:S ratios are those of neat decanethiol, within experimental uncertainties;

(h) Differential scanning calorimetry (DSC): This characterization, performed on a 6 mg sample (dry powder) of nanoparticles, showed a broad, endothermic transition beginning at ≈95° C. and peaking at 120° C. (18 J/g);

(i) Thermogravimetric analysis (TGA): This characterization, performed on a 5 mg sample (dry powder) of nanoparticles, showed a maximal rate of weight loss at approximately 235° C. The total weight loss was found to be consistent with the total amount of bonded ligands found by elemental analysis;

(j) Solubility tests: This characterization, performed on dry powder samples of nanoparticles yielded excellent solubility in hexane, toluene, chloroform, dichloromethane, pyridine, benzene, and several other organic solvents. Maximum solubility was found to be in the range 20–30 mg/mL.

EXAMPLE 2

(a) 112 mg (0.284 mmol) of $HAuCl_4 \cdot 3H_2O$ was dissolved by stirring in 25 mL of deionized water to yield a clear, yellow solution;

(b) 0.363 g (0.666 mmol) of $N(C_8H_{17})_4Br$ was dissolved by stirring in 25 mL of toluene to yield a clear solution and then added to the rapidly-stirring aqueous solution of the Au salt (solution (a)). An immediate two-layer separation resulted, with an orange/red organic phase on top and an orange-tinted aqueous phase on the bottom. This mixture is vigorously stirred until all color disappeared from the aqueous phase, indicating quantitative transfer of the $AuCl_4^-$ moiety into the organic phase;

(c) 0.574 g (3.10 mmol) of $C_{12}H_{25}NH_2$ (dodecylamine) was placed in 25 mL of toluene and then this mixture was added to the rapidly stirring two-phase mixture from (a) & (b). Upon the addition of this solution, the aqueous layer immediately became beige/murky white;

(d) 0.165 g (4.86 mmol) of $NaBH_4$ was dissolved in 25 mL of deionized water to yield an effervescent, cloudy solution and then this mixture was added to the rapidly stirring mixture from (a), (b), and (c). There was an instant color change of the organic phase to black/brown and then quickly (1 minute) to dark purple. After 10 minutes, the aqueous layer became clear and colorless. The reaction was continued at room temperature and room pressure (kept open to ambient atmosphere) for ≈12 hour while rapidly stirring. Once the reaction time was finished, the aqueous phase was separated and discarded, and the dark purple organic phase was reduced in volume to ≈5 mL by rotary evaporation. To this 5 mL toluene/particle solution was added 350 mL of methanol and this mixture was cooled to −60° C. for twelve hours. The dark purple/black precipitate was then vacuum filtered using 0.65 mm nylon filter paper, washed with an excess of methanol (200 mL), and dried on a vacuum line to give ≈60 mg of dry product. This 60 mg of particles was redissolved in 50 mL of toluene, reprecipitated, and rewashed by the procedure described just previously, to yield 60 mg of dry product. The particles were finally either stored as a powder in the freezer or at room temperature, or they were redissolved in a preferred amount of an organic solvent, such as hexane, toluene, chloroform, and the like, to yield a solution with a concentration ranging from 1–30 mg/mL. These solutions were either stored in the freezer or at room temperature. When stored as powders at room temperature, the particles exhibit a certain degree a metastability. That is, the particles are unstable with respect to particle aggregation and quickly lose their solubility over a matter of a few days.

The nanoparticles were characterized by the following:

(a) X-ray diffraction (XRD): This characterization, performed on a powder of the particles, showed that the particles were crystalline with diffraction peaks like those of fcc Au (except for the broadening at finite size). The main reflections were: (111) at 2Θ approx. 38.2°, (200) at Θ=approx. 44.4°, (220) at 2Θ approx. 64.60°, (311) at 2Θ=approx. 77.5°, (222) at 2Θ=approx. 81.8°. Also, using diffraction peak linewidth broadening, the average domain size was determined to be 26±3 Å;

(b) Ultraviolet-visible spectroscopy (UV/vis): This characterization, performed on dilute hexane or toluene solutions of the nanoparticles, showed one main, broad absorption feature at $\lambda_{max}$=517 nm;

(c) infrared spectroscopy (IR): This characterization, performed on a film of solid particles that were deposited on an NaCl window by evaporation of several drops of a particle/hexane solution, showed dodecylamine bands in the regions from ≈3310–2990 $cm^{-1}$(N—H stretch), ≈3000–2850 $cm^{-1}$ (C—H allphatic stretch), ≈1700–1300 $cm^{-1}$ (N—H band @ 1600 $cm^{-1}$ and $CH_2$ scissor @ 1450 $cm^{-1}$), ≈1100–1050 $cm^{-1}$ (C—N stretch), and ≈900–700 $cm^{-1}$ (N—H wag);

(d) Nuclear magnetic resonance spectroscopy (NMR): This characterization, performed on concentrated particles/$CDCl_3$ solutions (10 mg/mL), showed three broad multiplets at δ=1.56, 1.35, and 85 ppm, with intensities of roughly 2:2:1. These peaks are superimposed on a fourth, very broad signal in the range of δ=2.0–0.50 ppm;

(e) Mass spectroscopy (MS): This characterization, performed on solid samples, showed the typical fragmentation pattern of straight-chain primary amines as well as molecular ion peaks of the amines. MS ($Au_x$dodecylamine$_y$),m/e (%); 30 (100%) [—$CH_2NH_2$]$^+$, 185 ($M^+$, 4%) [$C_{12}H_{27}N$]$^+$;

(f) Transmission electron microscopy (TEM): This characterization, performed on samples prepared by evaporating a drop of a dilute particle/hexane solution onto an amorphous carbon-coated Cu TEM grid, yielded TEM micrographs of the particles which indicated that the particles were predominantly spherical in morphology, that they were present with a broad size distribution (σ≈20%), and that the average domain size was ≈30 Å;

(g) X-ray photoelectron spectroscopy (XPS): This characterization, performed on a uniform film of nanoparticles (several micrometers thick) supported on nylon filter paper, showed the appropriate signals for gold ($5p_{3/2}$, $4f_{7/2}$, $4f_{5/2}$, $4d_{5/2}$, $4d_{3/2}$, and $4p_{3/2}$ at ≈59, 84, 87, 336, 366, and 548 eV, respectively), carbon (1s at ≈285.3 eV), and Oxygen (1s at ≈531.8 eV). Also observed were signals for Br ($3p_{3/2}$ peak at 183.5 eV, $3p_{1/2}$ peak at 189.5 eV, and 3d peak at ≈68.0 eV). The peak positions, line shapes, and peak-to-peak distance of the Au 4f doublet are the standard measure of the gold oxidation state. The binding energies for the Au 4f doublet are 83.5(3) and 87.2(3) eV (peak-to-peak distance of 3.7 eV). These measurements are consistent with the Au° oxidation state;

(h) Elemental analysis (EA): The analyses yielded 89.12% Au, 0.79% N, 2.00% H, and 9.20% C. The corresponding Au:N molar ratio of the nanoparticles was 7.9:1, and the C:H and C:N ratios are those of neat dodecylamine, within experimental uncertainties;

(i) Differential scanning calorimetry (DSC): This characterization, performed on a 7 mg sample (dry powder) of nanoparticles, showed a broad, exothermic transition(s) extending from ≈50° C. to 130° C., which includes a relatively sharp endothermic feature centered at 90° C. (7 J/g);

(j) Thermogravimetric analysis (TGA): This characterization, performed on a 5 mg sample (dry powder) of nanoparticles, showed a maximal rate of weight loss at approximately 250° C. The total weight loss was found to be consistent with the total amount of bonded ligands found by elemental analysis;

(k) Solubility tests: This characterization, performed on dry powder samples of nanoparticles yielded excellent solubility in hexane, toluene, chloroform, dichloromethane, pyridine, benzene, and several other organic solvents. Maximum solubility was found to be in the range of 22–30 mg/mL.

EXAMPLE 3

The process of EXAMPLE 2 was repeated except that no phase transfer reagent was used, a small amount of insoluble black-solid particulate material was generated during the synthesis, and this precipitate was removed by filtration of the two-phase system with submicron filter paper just before the precipitation step. That is, the insoluble precipitate was removed by filtration of the two-phase system with 0.66 micron filter paper. The aqueous phase was then separated and discarded, and the dark-purple organic phase was reduced in volume to ≈5 mL by rotary evaporation. The particles were then precipitated, reprecipitated, and stored in the manner described in EXAMPLE 2.

Particle composition, size, and properties may be varied by means of the following changes: the variation of the metal precursor used, the variation of phase transfer reagents used or their omission from the synthetic procedure, the variation of one or more surface passivants used, the variation of the reducing agent used, or the variation of some of the reactant molar ratios, or any combination thereof.

The nanoparticles were characterized by the following:

(a) X-ray diffraction (XRD): This characterization, performed on a powder of the particles, showed that the particles were crystalline with diffraction peaks like those of fcc Au (except for the broadening at finite size). The main reflections were: (111) at 2Θ=approx. 38.2°, (200) at 2Θ=approx. 44.4°, (220) at 2Θ=approx. 64.6°, (311) at 2Θ=approx. 77.5°, (222) at 2Θ=approx. 81.8°. Also, using diffraction peak line-width broadening, the average domain size was determined to be 55±7 Å;

(b) Ultraviolet-visible spectroscopy (UV/vis): This characterization, performed on dilute hexane or toluene solutions of the nanoparticles, showed one main, broad absorption feature at $\lambda_{max}$=525 nm;

(c) infrared spectroscopy (IR): This characterization, performed on a film of solid particles that were deposited on an NaCl window by evaporation of several drops of a particle/hexane solution, showed dodecylamine bands in the regions from ≈3310–2990 cm$^{-1}$ (N—H stretch), ≈3000–2850 cm$^{-1}$ (C—H aliphatic stretch), ≈1700–1300 cm$^{-1}$ (N—H bend @ 1600 cm$^{-1}$ and $CH_2$ scissor @ 1450 cm$^{-1}$), ≈1100–1050 cm$^{-1}$ (C—N stretch), and ≈900–700 cm$^{-1}$ (N—H wag);

(d) Nuclear magnetic resonance spectroscopy (NMR): This characterization, performed on concentrated particle/$CDCl_3$ solutions (10 mg/mL), showed three broad multiplets at δ=1.54, 1.32, and 0.85 ppm, with intensities of roughly 2:2:1. These peaks are superimposed on a fourth, very broad signal in the range of δ=2.0–0.50 ppm;

(e) Mass spectroscopy (MS): This characterization, performed on solid samples, showed the typical fragmentation pattern of straight-chain primary amines as well as molecular ion peaks of the amines. MS ($Au_x$dodecylamine$_y$), m/e (%): 30 (100%) [—$CH_2NH_2$]$^+$, 185 ($M^+$, 4%) [$C_{12}H_{27}N$]$^+$;

(f) Transmission electron microscopy (TEM): This characterization, performed on samples prepared by evaporating a drop of a dilute particle/hexane solution onto an amorphous carbon-coated Cu TEM grid, yielded TEM micrographs of the particles which indicated that the particles were predominantly spherical in morphology, that they were present with a broad size distribution (σ≈20%), and that the average domain size was, ≈50 Å;

(g) X-ray photoelectron spectroscopy (XPS): This characterization, performed on a uniform film of nanoparticles (several micrometers thick) supported or nylon filter paper, showed the appropriate signals for gold ($5p_{3/2}$, $4f_{7/2}$, $4f_{5/2}$, $4d_{5/2}$, $4d_{3/2}$, and $4p_{3/2}$ at ≈59, 84, 87, 336, 366, and 548 eV, respectively), carbon (1s at ≈285.3 eV), and Oxygen (1s at ≈531.8 eV). Signals for Br ($3p_{3/2}$ peak at 183.5 eV, $3p_{1/2}$ peak at 189.5 eV, and 3d peak at ≈68.0 eV) were not observed. The peak positions, line shapes, and peak-to-peak distance of the Au 4f doublet are the standard measure of the gold oxidation state. The binding energies for the Au 4f doublet are 83.5(3) and 87.2(3) eV (peak-to-peak distance of 3.7 eV). These measurements are consistent with the Au° oxidation state;

(h) Elemental analysis (EA): The analyses yielded 90.58% Au, 0.75% N, 1.69% H, and 9.51% C. The corresponding Au:N molar ratio of the nanoparticles was 8.6:1, and the C:H and C:N ratios are those of neat dodecylamine, within experimental uncertainties;

(i) Differential scanning calorimetry (DSC): This characterization, performed on a 8 mg sample (dry powder) of nanoparticles, showed a strong, broad, exothermic transition beginning at ≈50° C. with a relatively sharp, and relatively endothermic feature peaking near 110° C. (4 J/g);

(j) Thermogravimetric analysis (TGA): This characterization, performed on a 5 mg sample (dry powder) of nanoparticles, showed a maximal rate of weight loss at approximately 250° C. The total weight loss was found to be consistent with the total amount of bonded ligands found by elemental analysis;

(k) Solubility tests: This characterization, performed on dry powder samples of nanoparticles yielded excellent solubility in hexane, toluena, chloroform, dichloromethane, pyridine, benzene, and several other organic solvents. Maximum solubility was found to be in the range of 22–30 mg/mL.

EXAMPLE 4

(a) 547 mg of $(C_8H_{17})_4NBr$ (phase transfer reagent) was dissolved in 10 mL of toluene and sonicated for 2 minutes;

(b) 119 mg of $CoCl_2 \cdot 6H_2O$ was dissolved in 15 mL of $H_2O$ by sonication for 15 minutes;

(c) The toluene and aqueous solutions from steps (a) and (b), respectively, were combined and stirred together for 15 minutes, which resulted in a blue-colored toluene layer. The aqueous phase was then separated from the organic phase and discarded;

(d) 98 mg of $HAuCl_4$ was dissolved in 15 mL $H_2O$ and then mixed with a 137 mg $(C_8H_{17})_4NBr$ in 20 mL toluene solution. The $AuCl_4$ ions were transferred from the aqueous to the toluene phase (organic Phase color becomes red/orange) and then the aqueous phase was separated and discarded;

(e) The two solutions of metal precursors (1:2 Au:Co molar ratio) in toluene (solutions from step (c) and (d)) were merged and stirred for 5 minutes;

(f) 0.36 mL of $C_{12}H_{25}SH$ (surface passivant) was added to the toluene solution from (e) and stirred for 2 minutes. The mixture turned blue/gray in color;

(g) A solution of 283 mg $NaBH_4$ (reducing agent) in 3 mL $H_2O$ was added to the toluene phase from step (f) and the reaction was allowed to proceed for 6 hours while stirring. Then, the black-colored toluene phase was separated from the aqueous phase and rotary evaporated down to 5 mL. The concentrated solution was put in a freezer for 12 hours and then filtered, while cold, to remove phase transfer reagent that had crystallized out of the organic phase solution. The nanoparticles, still dissolved in the organic phase, were then precipitated by the addition of 300 mL of methanol. The particles/toluene/methanol solution was sonicated for 10 minutes and then filtered through 0.2 mm nylon filter paper. The filtrate was clear and the particles were black. The weight of residue on the filter paper was 41 mg. This residue was redissolved in 5 mL toluene, and the solution was sonicated for 15 minutes and filtered. Then, the particles were precipitated again (using 200 mL of methanol) and filtered. The weight of the resoluble, final residue was 20 mg. The particles were finally either stored as a powder in the freezer or at room temperature, or they were redissolved in a preferred amount of an organic solvent, such as hexane, toluene, chloroform, and the like, to yield a solution with a concentration ranging from 1–30 mg/mL. These solutions were either stored in the freezer or at room temperature.

The nanoparticles were characterized by the following materials characterization techniques:

(a) X-ray diffraction (XRD): This characterization, performed on a powder of the particles, showed that the particles were crystalline with diffraction peaks like those of fcc Au (except for the broadening at finite size). The main reflections were: (111) at $2\Theta \approx$ approx. 38.2°, (200) at $2\Theta \approx$ approx. 44.4°, (220) at $2\Theta \approx$ approx. 64.6°, (311) at $2\Theta \approx$ approx. 77.5°, (222) at $2\Theta \approx$ approx. 81.8°. Cobalt reflections were masked by those of gold. Also, using diffraction peak line-width broadening, the average domain size was determined to be 30±5 Å;

(b) Ultraviolet/visible spectroscopy (UV/vis); This characterization, performed on dilute hexane or toluene solutions of the nanoparticles, showed one main, broad absorption feature at $\lambda_{max}$=520 nm;

(c) Infrared spectroscopy (IR): This characterization, performed on a film of solid particles that were deposited on an NaCl window by evaporation of several drops of a particle/hexane solution, showed the standard C—C and C—H stretches, as well as those for the thiol group. The stretches were in the regions of 2950–2750 $cm^{-1}$, 1500–1200 $cm^{-1}$, and 750–650 $cm^{-1}$;

(d) Transmission electron microscopy (TEM): This characterization, performed on samples prepared by evaporating a drop of a dilute particle/hexane solution onto an amorphous carbon-coated Cu TEM grid, yielded TEM micrographs of the particles which indicated that the particles were predominantly spherical in morphology, that they were present with a relatively narrow size distribution ($\sigma \approx 10\%$), and that the average domain size was $\approx$30 Å;

(e) X-ray, photoelectron spectroscopy (XPS): This characterization, performed on a uniform film of nanoparticles (several micrometers thick) supported on nylon filter paper, showed the appropriate signals for gold ($5p_{3/2}$, $4f_{7/2}$, $4f_{5/2}$, $4d_{5/2}$, $4d_{3/2}$, and $4p_{3/2}$ at $\approx$59, 84, 87, 336, 366, and 548 eV, respectively), carbon (1s at $\approx$285.3 eV), and Oxygen (1s at $\approx$531.8 eV). The peak positions, line shapes, and peak-to-peak distance of the Au 4f doublet are the standard measure of the gold oxidation state. The binding energies for the Au 4f doublet are 83.5(3) and 87.2(3) eV (peak-to-peak distance of 3.7 eV). These measurements are consistent with the Au° oxidation state. Also observed were the signals for cobalt (3s at 57 eV; $2p_{3/2}$ and $2p_{1/2}$ at 779 eV and 794 eV, respectively) and sulfur ($2p_{3/2}$ and $2p_{1/2}$ at 163 eV and 164 eV, respectively). An analysis of the XPS data revealed that the Co/Au alloy was comprised of about 3% Co and 97% Au;

(f) Solubility tests: This characterization, performed on dry powder samples of nanoparticles yielded excellent solubility in hexane, toluene, chloroform, dichloromethane, pyridine, benzene, and several other organic solvents. Maximum solubility was found to be in the range of 20–30 mg/mL.

EXAMPLE 5

(a) 10 g of DDAB was dissolved in 104 mL of toluene and sonicated for 10 minutes;

(b) 119 mg of $CoCl_2 \cdot 6H_2O$ was dissolved in the DDAB/toluene solution and sonicated for 5 hours to dissolve all of the Co salt in the toluene. The $CoCl_2$/DDAB/toluene solution had a typical cobalt blue color;

(c) 98 mg $HAuCl_4$ was dissolved in 15 mL $H_2O$ and mixed with a 137 mg $(C_8H_{17})_4NBr$ in 20 mL toluene solution. The $AuCl_4$ ions were transferred from the aqueous to the toluene phase (organic phase color becomes red/orange) and then the aqueous phase was separated and discarded;

(d) The two solutions (from steps (b) and (c)) of metal precursors (1:2 Au:Co molar ratio) in toluene were merged and stirred for 5 minutes. The solution had a dark green color;

(e) 0.18 mL of $C_{12}H_{25}SH$ (surface passivant) was added to the toluene solution from (d) and stirred for 2 minutes. The solution turned blue again;

(f) A solution of 283 mg NaBH$_4$ (reducing agent) in 3 mL H$_2$O was added to the toluene phase resulting from step (a), and the reaction was allowed to proceed for 5 hours while stirring. After 5 hours of reaction time, the toluene phase was diluted with 200 mL a toluene and washed with 500 mL of H$_2$O. A viscous, white DDAB/ water emulsion was formed and allowed to precipitate out of the thiol-capped Au/Co particles/toluene solution. The black particle/toluene solution was then separated and rotary evaporated to a concentrated 10 mL solution. 500 mL of methanol was then added to precipitate the particles. The particles/toluene/ methanol solution was sonicated for 30 minutes and then filtered through a 0.2 mm nylon filler paper. The filtrate was clear and the particles were black. The weight of residue on the filter paper was 69 mg. The residue was redissolved in 100 mL of toluene by sonication for 15 minutes and the solution was then filtered. 31 mg of the residue were not dissolved. The toluene solution was rotary evaporated down to 5 mL and the particles were precipitated again by addition of 300 mL of methanol and 15 minutes sonication. After filtering, the weight of the resoluble, final residue was 21 mg. The particles were finally either stored as a powder in the freezer or at room temperature, or they were redissolved in a preferred amount of an organic solvent, such as hexane, toluene, chloroform, and the like, to yield solution with a concentration ranging from 1–30 mg/mL. These solutions were either stored in the freezer or at room temperature.

The nanoparticles synthesized by the above procedures were characterized by the following materials characterization techniques:

(a) X-ray diffraction (XRD): This characterization, performed on a powder of the particles, showed that the particles were crystalline with diffraction peaks like those of fcc Au (except for the broadening at finite size). The main reflections were: (111) at 2Θ=approx. 38.2°, (200) at 2Θ=approx. 44.4°, (220) at 2Θ=approx. 64.6°, (311) at 2Θ=approx. 77.5°, (222) at 2Θ=approx. 81.8°. Cobalt reflections were masked by those of gold. Also, using diffraction peak line-width broadening, the average domain size was determined to be 15±2 Å;

(b) Ultraviolet-visible spectroscopy (UV/vis): This characterization, performed on dilute hexane or toluene solutions of the nanoparticles, showed one main, broad absorption feature at $\lambda_{max}$=517 nm;

(c) Infrared spectroscopy (IR): This characterization, performed on a film of solid particles that were deposited on an NaCl window by evaporation of several drops of a particle/hexane solution, showed the standard C—C and C—H stretches, as well as those for the thiol group. The stretches were in the regions of 2950–2750 cm$^{-1}$, 1500–1200 cm$^{-1}$, and 750–450 cm$^{-1}$;

(d) Transmission electron microscopy (TEM): This characterization, performed on samples prepared by evaporating a drop of a dilute particle/hexane solution onto an amorphous carbon/coated Cu TEM grid, yielded TEM micrographs of the particles which indicated that the particles were predominantly spherical in morphology, that they were present with a relatively narrow size distribution (σ≈7%), and that the average domain size was ≈15 Å;

(e) X-ray photoelectron spectroscopy (XPS): This characterization, performed on a uniform film of nanoparticles (several micrometers thick) supported on nylon filter paper, showed the appropriate signals for gold (5p$_{3/2}$, 4f$_{7/2}$, 4f$_{5/2}$, 4d$_{3/2}$, and 4p$_{3/2}$ at ≈59, 84, 87, 336, 366, and 548 eV, respectively), carbon (1s at ≈285.3 eV), and Oxygen (1s at ≈531.8 eV). The peak positions, line shapes, and peak-to-peak distance of the Au 4f doublet are the standard measure of the gold oxidation state. The binding energies for the Au 4f doublet are 83.5(3) and 87.2(3) eV (peak-to-peak distance of 3.7 eV). These measurements are consistent with the Au° oxidation state. Also observed were the signals for cobalt (3s at 57 eV; 2p$_{3/2}$ and 2p$_{1/2}$ at 779 eV and 794 eV, respectively) and sulfur (2p$_{3/2}$ and 2p$_{1/2}$ at 163 eV and 164 eV, respectively). An analysis of the XPS data revealed that the Co/Au alloy was comprised of about 2% Co and 98% Au;

(f) Solubility tests: This characterization, performed on dry powder samples of nanoparticles yielded excellent solubility in hexane, toluene, chloroform, dichloromethane, pyridine, benzene, and several other organic solvents. Maximum solubility was found to be in the range of 20–30 mg/mL.

EXAMPLE 6

(a) Dodecanethiol-functionalized Ag nanocrystals (average domain size of 3 nm) were first prepared according to the procedure of EXAMPLE 1, except that AgNO$_3$ was used as the metal source and dodecanethiol was used as the thiol;

(b) A 6 mg/mL solution of the Dodecanethiol-functionalized Ag nanocrystals was prepared by dissolving 24 mg of particles in 4 mL of hexane to yield an intensely-colored (dark brown) solution;

(c) A separate solution (micelle solution) consisting of 20 g of sodium dodecylsulfate (SDS) dissolved in 300 mL of deionized H$_2$O was prepared. This yielded a 6.25 weight percent solution of SDS in H$_2$O; (d) 1 mL of the 6 mg/Ag particle/hexane solution was added to 20 mL of the 6.25 weight percent solution of SDS in H$_2$O resulting in a two-layer mixture (organic layer on top and aqueous layer on the bottom). This mixture was stirred vigorously for a period of 6 hours. The dark-brown color of the organic solution is transferred to the aqueous micelle solution to yield an amber-colored single phase system (no two layer separation exists anymore). This signifies the solubilization of the metal nanocrystals in the aqueous media. As a by-product of this solubilization procedure, a small amount of bulk metal precipitates. This metal precipitate was removed by filtration with 0.65 micron nylon filter paper to yield 1 mg of black, insoluble particulate material. The entire above procedure was repeated several times in order to increase the concentration of the metal nanocrystals in the aqueous media. A concentration of 0.10 mg/mL (0.01 wt. % Ag) was ultimately achieved here.

The aqueous solutions of nanoparticles were characterized by the following techniques:

(a) Ultraviolet-visible spectroscopy (UV/vis): This characterization, performed on dilute particle/hexane/ SDS/water solutions, showed one main, broad absorption feature at $\lambda_{max}$=450 nm (this represents the characteristic optical signature of monodisperse silver colloids);

(b) Transmission electron microscopy (TEM): This characterization, performed on samples prepared by evaporating a drop of a dilute particle/hexane/SDS/ water solution onto an amorphous carbon-coated Cu TEM grid, yielded TEM micrographs of the particles which indicated that the particles were present with the same structural properties (e.g., shape, size, and size distribution) as those of the original dodecanethiol/functionalized Ag nanocrystals used for solubilization. Specifically, this analysis showed that the particles were predominantly spherical in morphology, that they were present with a relatively narrow size distribution ($\sigma\approx 10\%$), and that the average domain size was $\approx 30$ Å.

EXAMPLE 7

(a) 225 mg (0.510 mmol) of $H_2PtCl_6 \cdot 5H_2O$ was dissolved by stirring in 25 mL of deionized water to yield a clear, orange-yellow solution;

(b) 0.620 g (1.13 mmol) of $N(C_8H_{17})_4Br$ was dissolved by stirring in 25 mL of toluene to yield a clear solution and then added to the rapidly-stirring aqueous solution of the Pt salt (solution (a)). An immediate two-layer separation resulted, with an orange/red organic phase on top and an orange-yellow (tinted) aqueous phase on the bottom. This mixture is vigorously stirred until all color disappeared from the aqueous phase, indicating quantitative transfer of the $PtCl_6^{-2}$ moiety into the organic phase;

(c) 0.095 g (0.511 mmol) of $C_{12}H_{25}NH_2$ (dodecylamine) was placed in 25 mL of toluene and then this mixture was added to the rapidly stirring two-phase mixture from (a) and (b). Upon the addition of this solution, the aqueous layer immediately became beige/white;

(d) 0.212 g (5.61 mmol) of $NaBH_4$ was dissolved in 25 mL of deionized water to yield an effervescent, cloudy solution and then this mixture was added to the rapidly stirring mixture from (a), (b) and (c). There was an instant color change of the organic phase to black/brown and then quickly (1 minute) to dark brown. After 5 minutes, the aqueous layer became clear and colorless. The reaction was continued at room temperature and room pressure (kept open to ambient atmosphere) for $\approx 12$ hour while rapidly stirring.

Once the reaction time was finished, the aqueous phase was separated and discarded, and the dark-brown organic phase was reduced in volume to $\approx 5$ mL by rotary evaporation. To this 5 mL toluene/particle solution was added 350 mL of methanol and this mixture was cooled to $-60°$ C. for twelve hours. The dark-brown precipitate was then vacuum filtered using 0.65 μm nylon filter paper, washed with an excess of methanol (220 mL), and dried on a vacuum line to give $\approx 55$ mg of dry product. This 55 mg of particles was redissolved in 50 mL of toluene, reprecipitated, and rewashed by the procedure described just previously, to yield 47 mg of dry product. The particles were finally either stored as a powder in the freezer or at room temperature, or they were redissolved in a preferred amount of an organic solvent (e.g., hexane, toluene, chloroform, and the like) to yield a solution with a concentration ranging from 1–30 mg/ML. These solutions were either stored in the freezer or at room temperature.

The nanoparticles were characterized by the following:

(a) X-ray diffraction (XRD): This characterization performed on a powder of the particles, showed that the particles were crystalline with diffraction peaks like those of fcc Pt (except for the broadening at finite size). The main reflections were: (111) at $2\Theta$=approx. 38.2°, (200) at $2\Theta$=approx. 44.4°, (220) at $2\Theta$=approx. 64.6°, (311) at $2\Theta$=approx. 77.5°, (222) at $2\Theta$=approx. 81.8°. Also, using diffraction peak line-width broadening, the average domain size was determined to be +±4 Å;

(b) Ultraviolet-visible spectroscopy (UV/vis): This characterization, performed on dilute hexane or toluene solutions of the nanoparticles, did not show an absorption feature in the visible spectrum between 300–800 nm (this is as expected because Pt is not a 'one-electron' metal);

(c) infrared spectroscopy (IR): This characterization, performed on a film of solid particles that were deposited on an NaCl window by evaporation of several drops of a particle/hexane solution, showed dodecylamine bands in the regions from $\approx 3310$–$2990$ $cm^{-1}$ (N—H stretch), $\approx 3000$–$2850$ $cm^{-1}$ (C—H aliphatic stretch), $\approx 1700$–$1300$ $cm^{-1}$ (N—H bend @ 1600 $cm^{-1}$ and $CH_2$ scissor @ 1450 $cm^{-1}$), $\approx 1100$–$1050$ $cm^{-1}$ (C—N stretch), and $\approx 900$–$700$ $cm^{-1}$ (N—H wag);

(d) Nuclear magnetic resonance spectroscopy (NMR): This characterization, performed on concentrated particle/$CDCl_3$ solutions (10 mg/mL), showed three broad multiplets at $\delta=1.56$, 1.34, and 0.87 ppm, with intensities of roughly 2:2:1. These peaks are superimposed on a fourth, very broad signal in the range of $\delta=2.1$–$0.55$ ppm;

(e) Transmission electron microscopy (TEM): This characterization, performed on samples prepared by evaporating a drop of a dilute particle/hexane solution onto an amorphous carbon-coated Cu TEM grid, yielded TEM micrographs of the particles which indicated that the particles were predominantly spherical in morphology, that they were present with a relatively narrow size distribution ($\sigma\approx 15\%$), and that the average domain size was $\approx 26$ Å;

(f) Solubility tests: This characterization, performed on dry powder samples of nanoparticles yielded excellent solubility hexane, toluene, chloroform, dichloromethane, pyridine, benzene, and several other organic solvents. Maximum solubility was found to be in the range of 25–30 mg/mL.

EXAMPLE 8

(a) 197 mg (0.450 mmol) of $Na_2PdCl_6 \cdot 4H_2O$ was dissolved by stirring in 25 mL of deionized water to yield a clear, gray/black solution;

(b) 0.494 g (0.900 mmol) of $N(C_8H_{17})_4Br$ was dissolved by stirring in 25 mL of toluene to yield a clear solution and then added to the rapidly-stirring aqueous solution of the Pd salt (solution (a)). An immediate two-layer separation resulted. This mixture is vigorously stirred until all color disappeared from the aqueous phase, indicating quantitative transfer of the $PdCl_6^{-2}$ moiety into the organic phase (black);

(c) 0.086 g (0.465 mmol) of $C_{12}H_{25}NH_2$ (dodecylamine) was placed in 25 mL of toluene and then this mixture was added to the rapidly stirring two-phase mixture from (a) & (b). Upon the addition of this solution, the aqueous layer immediately became beige/white;

(d) 0.171 g (4.52 mmol) of $NaBH_4$ was dissolved in 25 mL of deionized water to yield an effervescent, cloudy solution and then this mixture was added to the rapidly stirring mixture from (a), (b), and (c). There was an instant color change of the organic phase to dark black. After 5 minutes, the aqueous layer became clear and colorless. The reaction was continued at room temperature and room pressure (kept open to ambient atmosphere) for $\approx 12$ hour while rapidly stirring. Once the reaction time was finished, the aqueous phase was separated and discarded, and the dark-black organic phase was reduced in volume to ≈5 mL by rotary evaporation. To this 5 mL toluene/particle solution was added 350 mL of methanol and this mixture was cooled to −60° C. for twelve hours. The dark-black precipitate was then vacuum filtered using 0.65 mm nylon filter paper, washed with an excess of methanol (200 mL), and dried on a vacuum line to give ≈50 mg of dry product. This 50 mg of particles was redissolved in 50 mL of toluene, reprecipitated, and rewashed by the procedure described just previously, to yield 39 mg of dry product. The particles were finally either stored as a powder in the freezer or at room temperature, or they were redissolved in a preferred amount of an organic solvent, such as hexane, chloroform, and the like to yield a solution with a concentration ranging from 1–30 mg/mL. These solutions were either stored in the freezer or at room temperature.

The nanoparticles were characterized by the following:

(a) X-ray diffraction (XRD): This characterization, performed on a powder of the particles, showed that the particles were crystalline with diffraction peaks like those of fcc Pd (except for the broadening at finite size). The main reflections were: (111) at 2Θ=approx. 38.2°, (200) at 2Θ=approx. 44.4°, (220) at 2Θ=approx. 77.5°, (311) at 2Θ=approx. 77.5°, (222) at 2Θ=approx. 81.8°. Also, using diffraction peak line-width broadening, the average domain size was determined to be 20±3 Å;

(b) Ultraviolet-visible spectroscopy (UV/vis): This characterization, performed on dilute hexane or toluene solutions of the nanoparticles, did not show an absorption feature in the visible spectrum between 300–800 nm (this is as expected because Pd is not a 'one-electron' metal);

(c) Infrared spectroscopy (IR): This characterization, performed on a film of solid particles that were deposited on an NaCl window by evaporation of several drops of a particle/hexane solution, showed dodecylamine bands in the regions from ≈3310–2990 cm$^{-1}$ (N—H stretch), ≈3000–2850 cm$^{-1}$ (C—H aliphatic stretch), ≈1700–1300 cm$^{-1}$ (N—H bend @ 1600 cm$^{-1}$ CH$_2$ scissor @ 1450 cm$^{-1}$), ≈1100–1050 cm$^{-1}$ (C—H stretch), and ≈900–700 cm$^{-1}$ (N—H wag);

(d) Nuclear magnetic resonance spectroscopy (NMR): This characterization, performed on concentrated particle/CDCl$_3$ solutions (10 mg/mL), showed three broad multiplets at δ=1.54, 1.36, and 192 ppm, with intensities of roughly 2:2:1. These peaks are superimposed on a fourth, very broad signal in the range of δ=2.1–0.60 ppm;

(e) Transmission electron microscopy (TEM): This characterization, performed on samples prepared by evaporating a drop of a dilute particle/hexane solution onto an amorphous carbon-coated Cu TEM grid, yielded TEM micrographs of the particles which indicated that the particles were predominately spherical in morphology, that they were present with a relatively narrow size distribution (σ≈10%), and that the average domain size was ≈18 Å;

(f) Solubility tests: This characterization, performed on dry powder samples of nanoparticles yielded excellent solubility hexane, toluene, chloroform, dichloromethane, pyridine, benzene and several other organic solvents. Maximum solubility was found to be in the range of 25–30 mg/mL.

The second step in producing the single-electron solid state devices of the present invention is forming nanocrystal layer assemblies or creating nanocrystal-host matrices.

Monolayer or multilayer assemblies (ordered or disordered) of organically functionalized metal or metal alloy nanocrystals can be deposited onto various substrates, such as Si, SiO$_2$, alumina, mica, GaAs, indium tin oxide, glasses, and polymer films. The nanocrystals can also be placed into a host of complex chemical environments, such as polymers, glasses, silica, alumina, sol-gels, and glassy carbon, to create a nanocrystal matrix composite. These methods may be used to prepare a range of novel metal nanocrystal-doped polymer thin film structures utilizing a variety of polymers, such as polystyrene, polymethylmetharylate, polyethers, polypropylene, polyethylene, PPV, and conductive polymers. Polymer solutions can be provided using alcohols, ketones, ethers, alkanes, alkenes, chloroform, TCE, or dichloromethane as solvents. A single kind of metal or metal alloy nanocrystal, or any combination of different metal or metal alloy nanocrystals can be used. These include organically functionalized Ag nanocrystal single or multilayer films, organically functionalized Au nanocrystal single or multilayer films, organically functionalized Pt nanocrystal single or multilayer films, organically functionalized Pd nanocrystal single or multilayer films, organically functionalized Au/Co nanocrystal single or multilayer films, or any combination of the organically functionalized metal nanocrystals such as a multilayer structure with an Ag/Au/Ag nanocrystal configuration or Ag/Pt/Au nanocrystal configuration. Any stoichiometric combination of the organically functionalized metal nanocrystals can be used, for example, a 20% Ag/20% Au/10% Pt nanocrystal/50% polymer configuration.

The following example illustrates self-assembled nanocrystal monolayer film formation.

EXAMPLE 9

1 mL of a hexane solution (5 mg/mL) of dodecanethiol-capped Ag nanocrystals prepared according to the procedure of Example 6 and having an average domain size of 30 Å (measured by X-ray diffraction) was placed onto a glass substrate patterned with a series of 1 mm wide by 10 mm long Al electrode strips. The solution was deposited with a dropper in five separate aliquots. The hexane/particle solution was then allowed to evaporate over a time span of 2 minutes. The result was an amber colored film of nanocrystals on the Al strips on the glass substrate. The film constitutes a self-assembled monolayer of nanocrystals with ordered domains whose dimensions extend over 0.1 to 1 mm. Optical measurements (UV/vis spectrophotometry) performed on areas of the substrate which contained partial particle layers over just glass and not Al, showed the typical plasmon resonance expected for Ag nanocrystal films in the visible region ($\lambda_{max}$ ≈480 nm).

The following example illustrates Langmuir nanocrystal monolayer or multilayer film formation and Langmuir-Schaeffer film formation.

EXAMPLE 10

(a) Dodecanethiol-capped Ag nanocrystals were first prepared according to the procedure of Example 6. The average domain size was 30 Å (measured by X-ray diffraction). The initial size distribution may be arbitrarily narrowed (depending on the amount of product available) using the technique of size-selective precipitation. The particles used here were selectively precipitated up to 6 times.

(b) After synthesis and size selection, a powder of the dodecanethiol-capped Ag particles (average diameter ≈30 Å) was dispersed by sonication in an acetone/ethanol solution and filtered in order to remove any residual organic material. The resulting dry powder was weighed and then dissolved in a known amount of chromatographed hexane to a concentration of ≈1 mg/mL (maximum solubility is 10–30 mg/mL). The solution was passed through a 0.2 mm pore size filter and stored in clean glassware in a refrigerator at −20° C. until used (same day) for Langmuir monolayer film formation.

(c) Langmuir monolayer film formation of the Ag nanocrystal solutions was performed. Briefly, for each individual film, 150 mL of a 1 mg/mL "clean" Ag nanocrystal/hexane solution was dispersed uniformly across the water surface (18 MΩ water; pH 5.7) of a Nima Technology Type 611 Langmuir trough at room temperature.

A typical nanocrystal monolayer structure is shown in FIG. 1. This figure represents a transmission electron micrograph (TEM) of a thin film (3.0 nm diameter nanocrystals) of a Ag nanocrystal monolayer prepared on a Langmuir trough and transferred to a TEM grid. The micrograph has been cropped to highlight the crystallographic orientation of the monolayer film. The two dimensional domains extend up to 1 μm or so in any given direction, but the particle density is continuous over the entire phase.

Pressure/Area isotherm measurements were then carried out to determine the specific features of the nanocrystal monolayer/multilayer phase diagram. A typical phase diagram (surface pressure, π vs. temperature) and the corresponding TEM micrographs of the condensed closest packed phase (2-D phase) and the collapsed monolayer phase (3-D phase) are clearly labeled in FIG. 2.

Once the nanocrystal monolayer/multilayer phase diagram was completely characterized, a film that had been compressed to just below the (2D)-(collapsed 2D) phase boundary (room temperature; applied pressure 8–15 milliNewtons/meter) was transferred as a Langmuir-Schaeffer film to a glass substrate that had been pre-patterned with a series of 1 mm wide by 10 mm long Al lines. The Langmuir-Schaeffer technique involves gently contacting the surface of the nanocrystal layer on the trough with the substrate and then lifting off a thin film.

Figure 2:
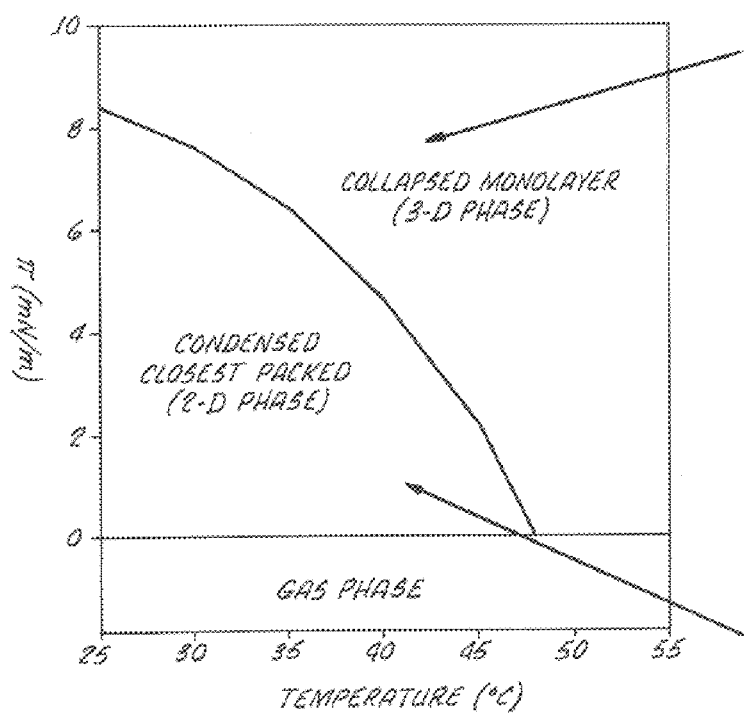
FIG. 2 is a phase diagram of a Langmuir monolayer/multilayer system of organically functionalized silver (Ag) nanocrystals showing TEM's of the condensed, closest-packed (2-D) phase as well as the collapsed monolayer (3-D) phase.
Figure 2:
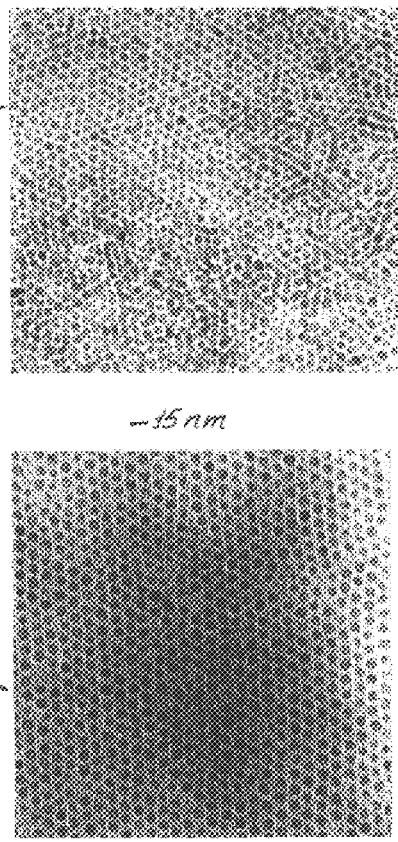

Transmission electron microscopy (Akashi EM002b operating at 200 KeV with 0.17 nm point-to-point resolution) was used to structurally characterize the nanocrystal Langmuir monolayer films after transfer onto TEM grids FIG. 1 and FIG. 2 show representative TEM micrographs of a 2-D closest packed phase of 30 Å diameter dodecanethiol-capped Ag nanocrystals. The micrograph in FIG. 1 is a relatively high resolution image which has been cropped to highlight the crystallographic structure of the phase.

The following example illustrates nanocrystal-host matrix formation.

EXAMPLE 11

(a) 10 mg of dodecanethiol-capped Ag nanocrystals prepared according to the procedure of Example 6 and having an average domain size of approximately 30 Å was added to 10 mg of polystyrene and then mixed with 2 mL of toluene (effectively a 50% by weight Ag film because the toluene evaporates during spin coating procedures);

(b) the 2 mL mixture from (a) was then spin coated onto a glass substrate (which contained patterned Al electrodes) at a rate of 3600 RPM, to generate a thin metal nanocrystal-doped polymer thin film.

(c) After evaporating a top Al electrode onto the thin film, dielectric, optical and film thickness measurements were carried out.

The film thickness was measured by profilometry to be 20 mm. The dielectric measurements of the metal nanocrystal-doped polymer thin film yielded unique dielectric values as compared to the pure or undoped polymer. The dielectric characteristics for the undoped polymer thin film were: a) dielectric constant=2; b) breakdown voltage=12 kv/mm. The dielectric characteristics for the metal nanocrystal-doped polymer thin film were: a) dielectric constant=15; b) breakdown voltage=1.2 kv/mm. As can be seen, the dielectric constant of the doped film increases by about a factor of 10. Optical characterization reveals one broad absorption feature at $\lambda_{max}$=465 nm. This feature is shifted to the red of that expected for free nanoparticles in solution; that is, where the nanoparticles are not part of a doped polymer film.

The third step in producing the single-electron solid state devices of the present invention is incorporating the nanocrystal monolayer or multilayer assemblies or nanocrystal host matrices as active elements into solid state devices. Parallel fabrication is preferably used.

Examples of such devices are volatile and non-volatile memory devices, logic devices, switching devices, and various charge storage devices such as capacitance devices, all of which may be fabricated by standard semiconductor processing techniques.

Figure 3:
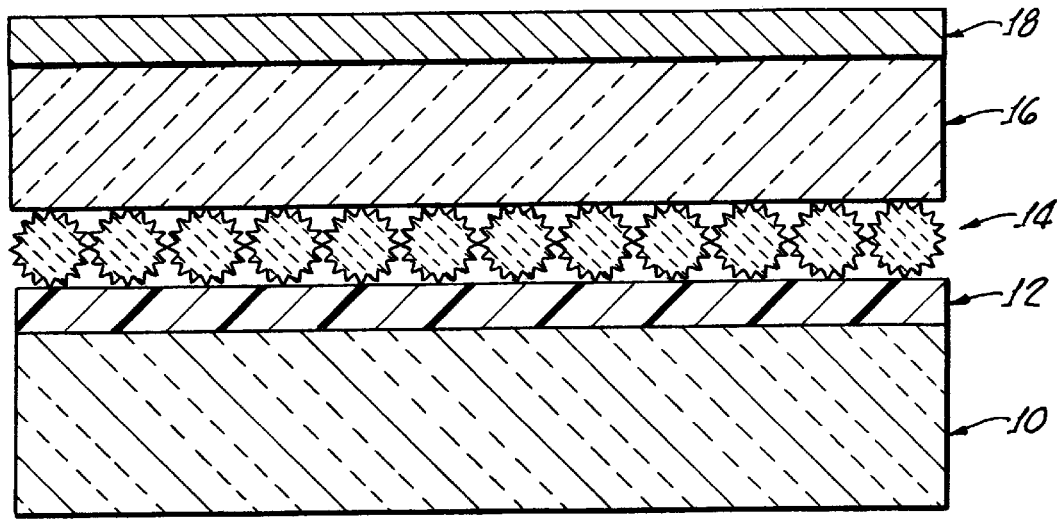
FIG. 3 is a cross-sectional view of a single-electron charging capacitance device.

A cross-section of a typical single-electron charging or capacitance device is shown in FIG. 3. The layer 10 is the substrate or device support medium. Examples of substrates that may be used are Si wafers, SiO$_2$, GaAs wafer, alumina, mica, glass, indium tin oxide, mica, and polymer films. Applied to substrate 10 is a bottom conductive electrode film 12. Any one of a host of standard conductors such as Al, Cu, Au, or Ag may be used. Deposited on the electrode 12 is a nanocrystal monolayer 14, comprised of a thin film of metal and/or metal alloy nanocrystals described in EXAMPLE 1–12 (in this case, a Langmuir-Schaeffer film of approximately 3.0 nm diameter Ag nanocrystals). The thin film nanocrystal layer can be a Langmuir-Schaeffer film or a self-assembled thin film containing nanocrystals having an average cross-section no larger than about 20 nm, preferably an average cross-section ranging from about 1 nm to 10 nm. Separating monolayer 14 from a top Al electrode film 18 is a dielectric spacer layer 16 (in this case, a thin film of PMMA as described below in EXAMPLE 12).

The dielectric spacer layer has a dielectric constant less than or equal to 10. Preferably, the dielectric spacer layer is provided as a thin film of polystyrene, polymethylmethacrylate, a polyether, polypropylene, polyethylene, PPV, or similar polymer. Atop dielectric spacer layer 16 is a top conductive film 18 which, like bottom conductive electrode film 12, can be any standard conductor, for example, Al, Cu, Au, or Ag. The active elements of the device are the organically functionalized metal nanocrystals arranged into a nanocrystal monolayer film (monolayer 14).

Figure 4:
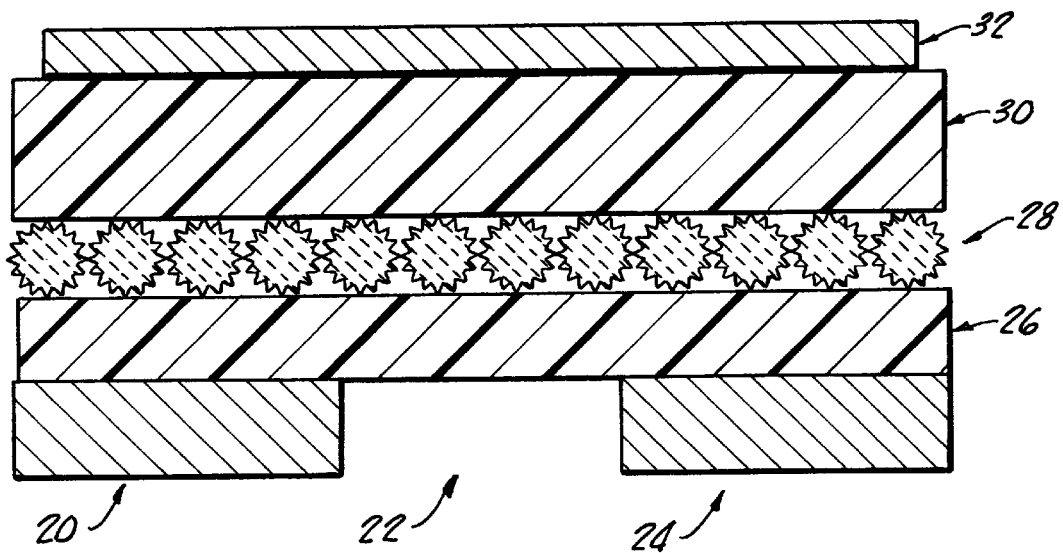
FIG. 4 is a cross-sectional view of a nanocrystal memory device.

A typical single-electron nanocrystal memory device is shown diagrammatically in cross-section in FIG. 4. It can be fabricated using standard semiconductor processing techniques. A source 20 and a drain 24 separated by a channel 22 are applied to a thin insulator layer 26 to which is applied a nanocrystal monolayer 28. A thick insulator layer 30 is applied to monolayer 28. A gate 32 is applied to insulator layer 30. The active elements of the device are organically functionalized metal nanocrystals arranged into a nanocrystal monolayer film (monolayer 28).

Thus, the memory device of the present invention has a source and drain region separated by a semiconductor channel, a first insulating layer deposited over the semiconductor channel, a thin film nanocrystal layer applied to the first insulating layer, a second insulating layer deposited over the nanocrystal layer, and a gate electrode applied to the second insulating layer.

The device characteristics may be varied by altering some key device parameters which include, for example, the substrate used, the nature of any electrodes incorporated into the device, the nature and thickness of any dielectric spacer layer which may be present in the device, the operating temperature, which can range from about 40° K to 330° K, the operating current and bias range, the size and size distribution of the nanocrystals used, the chemical composition of the nanocrystals, the geometric arrangement and layer structure of the nanocrystals, the actual device structure, that is, whether sandwich-type or other configuration, the proximity of the nanocrystals to each other and to the other elements of the device, and the dielectric environment surrounding the nanocrystals.

The following example illustrates parallel fabrication of devices involving the incorporation of assemblies of nanocrystal films or nanocrystal-host matrices as active device elements.

EXAMPLE 12

(a) A series of 1 mm wide by 10 mm long Al lines were deposited (at pressures on the order of $1 \times 10^{-6}$ torr) onto a 1 in. by 0.5 in. glass substrate. Standard metal evaporation techniques were used. This constitutes the electrode film discussed previously.

(b) A nanocrystal monolayer or multilayer film was deposited onto the Al-patterned glass substrate (by the techniques described in EXAMPLE 10). Alternatively, a nanocrystal/host matrix was placed onto the Al-patterned glass substrate (by standard pin-coating or evaporation techniques described in part (e) below).

(c) The nanocrystal monolayer or multilayer film/Al pattern/substrate combination was subjected to a chemical procedure to rigidify the film. The film was stabilized by replacing the organic surface passivants with dithiol molecules (e.g., 1,10-decanedithiol) by immersing the substrate into an ethanol/dithiol solution. This procedure chemically links the nanocrystals together and stabilizes the film against potential damage during subsequent processing steps. An example of this procedure follows. A 50 mL ethanol/dithiol solution (2% 1,10-decanedithiol by volume) containing an excess of 1,10-decanedithiol was prepared by mixing 49 mL of ethanol with 1 mL of 1,10-decanedithiol at room temperature, ambient pressure, and ambient atmosphere. The nanocrystal monolayer or multilayer film/Al pattern/substrate combination was then immersed in this solution for 12 hours. Over the course of this time, the original organic surface passivants on the nanocrystals were replaced with 1,10-decanedithiol molecules. After 12 hours, the substrate was taken out and rinsed with an excess of ethanol (100 mL). The substrate was then rinsed with an excess of hexane to test the solubility of the rigidified nanocrystal monolayer. The nanocrystal monolayer did not dissolve and this indicated that the film had been rigidified. Films which were rinsed with hexane before the ligand stabilization procedure did dissolve.

(d) 50 mL of a 1% (by-weight) poly-methylmethacrylate (PMMA) solution was prepared in methylisobutylketone (MIBK) by dissolving the requisite amount of PMMA in MIBK and sonicating at room temperature for 2 hours.

(e) Two separate aliquots (5 mL each) of the PMMA/MIBK solution were then spin-coated (substrate at room temperature and pressure, rotating at 3600 RPM) onto the rigidified nanocrystal monolayer/Al pattern/substrate combination. The solvent (MIBK) evaporated during the spin-coating procedure. The result was a dry, thin film of PMMA. Profilometry measurements indicated that the deposited PMMA layer was 35 nm thick.

(f) A pattern of 1 mm wide by 10 mm long Al lines, oriented perpendicular to the bottom Al line pattern, was evaporated onto the PMMA layer as described in section (a) above. For this step, the substrate was kept at 77° K to prevent thermal damage to the underlying particle layer. Ultimately, the processed substrate contained many active devices arranged in a parallel fashion, the number of which was only limited by the density of the Al grid lines. A cross-sectional view of a single device in a sandwich-type configuration is shown in FIG. 3 and FIG. 5A. In addition to the layers shown in FIG. 3 (previously described in detail), the device of FIG. 5A additionally has a natural growth passivation $Al_2O_3$ layer 13 between bottom Al electrode film 12 and nanocrystal monolayer 14.

(g) The final stage involves "wiring up" the device and measuring its electronic characteristics. For the present device, the Δ capacitance-voltage (ΔC-V) characteristics were measured.

After device construction, two Al electrode films (one top and one bottom) were bonded to wires using silver paint, and the wires were connected to the measuring circuit. The substrate was mounted on the cold-finger of an immersion Dewar, and cooled to 77° K. A voltage was applied across the circuit through the use of a function generator generating a 30–500 mV$_{p-p}$ amplitude sinusoidal wave floated with a tunable DC offset. The AC response of the device, as a function of the DC offset, was recorded with a lock-in amplifier.

The device may be considered to be a parallel array of double tunneling junctions. The resistance of the polymer layer is practically infinite. Therefore the particles/polymer/aluminum junction can be represented as a pure capacitive element. To analyze the AC response of the device, an equivalent RC circuit for the double junction may be drawn as illustrated in FIG. 5B. $C_1$ represents the particle/$Al_2O_3$/Al junction capacitance, R is the same junction's tunneling resistance, and $C_2$ represents the particle/PMMA/Al junction capacitance. Analysis of this RC circuit shows that the capacitance measured as the off-phase component of the AC current through the device is approximately $C_2$. As the voltage applied between the electrodes is varied (represented by electrode film layers 12 & 18, respectively, in FIG. 5C), single-electron energy levels of the particles are brought into resonance with the Fermi level of the nearby electrode. If the modulation is strong enough, electrons can tunnel back and forth between the Fermi level of the nearby electrode (Al electrode film layer 12) and the energy levels of the particles (particle monolayer 14), thereby producing charge oscillations on the remote electrode (Al electrode film 18) and an increase in the capacitance signal. This behavior is shown pictorially in FIG. 5C. Section 13 is the natural $Al_2O_{43}$ layer and Section 16 is the PMMA dielectric spacer layer.

FIG. 6 is a plot of representative measurements (ΔC-V characteristics) of the device operated at 77° K and 293° K.

A Coulomb blockade about zero-bias (asymmetric) and a step structure reminiscent of a Coulomb staircase is visible in both capacitance/voltage curves. However, these features are more pronounced in the 77° K scan. Each curve consists of a single (2 minute) voltage scan from positive to negative polarity of the bottom electrode. Each of the steps reflects an increase in capacitance of the device due to collective single-electron (or hole) charging of the particles in the monolayer film. The step structure is reproducible from device to device over multiple scans and different frequencies. The ΔC-V curves in FIG. 6 were taken with a relatively large amplitude modulation (400 mV$_{p-p}$). The step structure is still apparent at 77° K with 50 mV$_{p-p}$ modulation, although with lower signal-to-noise ratio. For the ambient temperature case, devices fabricated with a thicker tunneling barrier between the particles and the nearest electrode showed a better resolved step structure. From the step heights of both curves (about 0.1 pF), approximately $10^6$ particles, or <1% of the particles in a given junction, are being charged in each step. Control experiments on devices containing no nanoparticles revealed that no Coulomb blockade or staircase structure exists.

Deviations from the ideal behavior of a Coulomb blockade (symmetric structure about zero bias) and a Coulomb staircase (uniform step-width and structure) are expected for these devices. Physical phenomena that may influence the single-electron charging dynamics of the devices include: 1) low-temperature memory effects, similar to those previously observed for granular metal systems; 2) electrostatic interactions between adjacent particles (particle center-to-center distances here are about 4–5 nm); and 3) discrete conduction band energy levels.

The simple parallel fabrication technique for constructing single-electron solid state devices from closest-packed Ag nanocrystal phases of the present invention may be readily extended to include not only other kinds of devices and phases, but to semiconductor and other metal particles as well. Measurements similar to those described above, coupled with control over both particle film density and nanocrystal composition, should make it possible to probe discrete quantum energy levels and assess the influence of particle—particle interactions in nanocrystal-based solid state devices.

Thus, the present invention provides a single electron solid state electronic device and method of making same. The unique capabilities and characteristics of the device are: (1) the ability to operate at room temperature; (2) the ability to operate with multiple status states; (3) the ability to store varying amounts of electronic charge; (4) the capability of having an energy level spectrum dominated by simple electrostatics; (5) the ability to be constructed by parallel rather than serial fabrication techniques; (6) the ability to control the size and size distribution of the metal and/or metal alloy nanocrystals comprising the active device elements; (7) the ability to control the geometric arrangement and lateral and vertical densities of assemblies of the nanocrystals; (8) the ability to place the nanocrystals into complex environments, such as polymers, glasses, alumina, and the like; (9) the ability to deposit the nanocrystals onto various substrates, such as Si, SiO$_2$, alumina, mica, GaAs, indium tin oxide, glasses, and polymer films; and (10) the ability to fabricate monolayers as well as multilayers of the nanocrystals comprising the active device elements.

Although the present invention has been described with reference to preferred embodiments, workers skilled in the art will recognize that changes may be made in form and detail without departing from the spirit and scope of the invention.

REFERENCES (1) Averin, D; Likharev, K. K. *Single-Charge Tunneling*, Plenum: New York, 1992.
(2) Kastner, M. A. *Phys. Today*, 1993, 46,24.
(3) Averin, D. V.; Likharev, K. K. *Mesoscopic Phenomena in Solids*, Elsevier: Amsterdam, 1991.
(4) Colvin, V. L.; Schlamp, M. C.; Alivisatos, A. P., *Nature*, 1994, 370,354.
(5) Dabbousi, B. O.; Bawendi, M. G.; Onitsuka, O.; Rubner, M. F., *Appl. Phys. Lett.*, 1995, 66,1316.
(6) Schmidt, K. H.; Medeiros-Ribiero, G.; Oestreich, M.; Petroff, P. M.; Dohler, G. H., *Phys. Rev B*, 1996, 54,11346.
(7) Barner, J. B.; Ruggiero, S. T., *Phys. Rev. Lett.*, 1987, 59,807.
(8) Wilkins, R.; Ben-Jacob, E.; Jaklevic, R. C., *Phys. Rev. Lett.*, 1989, 63,801.
(9) Andres, R. P.; Bein, T.; Dorogi, M.; Feng, S.; Henderson, J. I.; Kubiak, C. P.; Mahoney, W.; Osifchin, R. G.; Reifenberger, R., *Science*, 1996, 272,1323.
(10) Hanafi, H. I.; Tiwari, S.; Khan, I., *IEEE Trans Electron Devices*, 1996, 43,1553.
(11) Tiwari, S.; Rana, F.; Chan, K.; Shi, L.; Hanafi, H. I; *Appl. Phys. Lett.*, 1996, 69,1232.
(12) Kuzmin, L. S.; Likharev, K. K., *JETP Lett.*, 1987, 45,495.
(13) Ashoori, R. C., *Nature*, 1996, 379,413.
(14) Whitesides, G. M.; Mathias, J. P.; Seto, C. T., *Science*, 1991, 254,1312.
(15) Murray, C. B.; Norris, D. J.; Bawendi, M. G., *J. Am. Chem. Soc.*, 1993, 115,8706.
(16) Leff, D. V.; Ohara, P. C.; Heath, J. R.; Gelbart, W. M., *J. Phys. Chem.*, 1995, 99,7136.
(17) Andres, R. P., et al., *Science*, 1996, 273,1690.
(18) Heath, J. R.; Knobler, C. M.; Leff, D. V., *J. Phys. Chem.*, 1997, 101,189.
(19) Murray, C. B.; Norris, D. J.; Bawendi, M. G., *J. Am. Chem. Soc.*, 1993, 115,8706.
(20) Lambe, J.; Jaklevic, R. C., *Phys. Rev. Lett.*, 1969, 22,1371.
(21) Cavicchi, R. E.; Silsbee, R. H., *Phys. Rev. B*, 1988, 38,6407.
(22) Dubois, J. G. A.; Gerritsen, J. W.; Schmid, G.; van Kempen, H., *Physica B*, 1996, 218,262.
(23) Ralph, D. C.; Black, C. T.; Tinkham, M., *Phys. Rev. Lett.*, 1995, 74,3214.
(24) Cavicchi, R. E.; Silsbee, R. H., *Phys. Rev. B*, 1988, 37,706.

We claim:

1. A solid state electronic device comprising:
   a substrate;
   a first conductive thin film layer deposited on said substrate;
   a thin film nanocrystal layer of organically functionalized metal or metal alloy nanocrystals deposited on and in contact with said first conductive thin layer;
   a dielectric spacer layer in contact with said thin film nanocrystal layer; and
   a second conductive thin film layer deposited on and in contact with said dielectric spacer layer devices exhibiting single-electron behavior.

2. The device of claim 1 wherein said substrate comprises a member selected from the group consisting of Si, SiO$_2$, alumina, mica, GaAs, indium tin oxide, glasses, and polymer films.

3. The device of claim 1 wherein said first conductive thin film layer comprises a member selected from the group consisting of aluminum, copper, gold, and silver.

4. The device of claim 1 wherein said thin film nanocrystal layer is comprised of a Langmuir-Schaeffer film.

5. The device of claim 1 wherein said thin film nanocrystal layer is comprised of a self-assembled thin film.

6. The device of claim 1 wherein said this film nanocrystal layer comprises nanocrystals having an average cross-section no larger than about 20 nm.

7. The device of claim 1 wherein said thin film nanocrystal layer comprises nanocrystals having an average cross-section ranging from about 1 nm to 10 nm.

8. The device of claim 1 wherein said metal nanocrystals comprise a member selected from the group consisting of alkali metals, alkaline earth metals, Group IIIa metals, transition metals, and Group IVa metals.

9. The device of claim 1 wherein said metal nanocrystals comprise a member selected from the group consisting of Au, Ag, Co, Sn, Fe, Cu, Ni, Pt, Rh, and Pd, and combinations thereof.

10. The device of claim 1 wherein said metal alloy nanocrystals comprise a combination of two or more metals selected from the group consisting of alkali metals, alkaline earth metals, Group IIIa metals, transition metals, and Group IVa metals.

11. The device of claim 1 wherein said metal alloy nanocrystals comprise a combination of two or more metals selected from the group consisting of Au, Ag, Co, Sn, Fe, Cu, Ni, Pt, Rh, and Pd.

12. The device of claim 1 wherein said thin film nanocrystal layer comprises a nanocrystal matrix composite.

13. The device of claim 12 wherein the matrix is a member selected from the group consisting of polymers, glasses, silica, alumina, sol-gels, and glassy carbon.

14. The device of claim 12 wherein the matrix comprises a polymer solution.

15. The device of claim 14 wherein the polymer is a member selected from the group consisting of polystyrene, polymethylmethacrylate, polyethers, polypropylene, polyethylene, PPV, and conductive polymers.

16. The electronic device of claim 13 wherein said polymer solution comprises a solvent selected from the group consisting of alcohols, ketones, ethers, alkanes, alkenes, chloroform, TCE, and dichloromethane.

17. The device of claim 1 wherein said dielectric spacer layer has a dielectric constant less than or equal to 10.

18. The device of claim 1 wherein said dielectric spacer layer comprises polymer thin films selected from the group consisting of polystyrene, polymethylmethacrylate, polyethers, polypropylene, polyethylene, and PPV.

19. The device of claim 1 wherein said second conductive thin film layer comprises a member selected from the group consisting of Al, Cu, Au, and Ag.

20. The device of claim 1 wherein the operating range is within the temperature range of 4° K to 330° K.

21. The device of claim 1 which functions as a charging device.

22. The device of claim 1 which functions as a memory device.

23. A solid state nanocrystal memory device exhibiting single-electron behavior manifested by Coulomb Blockade or Coulomb Staircase comprising:

a source and drain region separated by a semiconductor channel;

a first insulating layer deposited over said semiconductor channel;

a thin film nanocrystal layer applied to said first insulating layer, said thin film nanocrystal layer comprising organically functionalized metal or metal alloy nanocrystals;

a second insulating layer deposited over said nanocrystal layer; and a gate electrode applied to said second insulating layer.

* * * * *

UNITED STATES PATENT AND TRADEMARK OFFICE
CERTIFICATE OF CORRECTION

PATENT NO. : 6,159,620
DATED : December 12, 2000
INVENTOR(S) : Heath et al.

Page 1 of 1

It is certified that error appears in the above-identified patent and that said Letters Patent is hereby corrected as shown below:

Column 1,
After the title, the following Government Acknowledgment should be inserted:

This invention was made with Government support under Grant NO. DE-76SF00098, awarded by the Department of Energy and Grant No. N00014-95-F-0099, awarded by the Office of Naval Reasearch. The Government has certain rights in this invention.

Signed and Sealed this

Twenty-eighth Day of August, 2001

Attest:

NICHOLAS P. GODICI

Attesting Officer

Acting Director of the United States Patent and Trademark Office